United States Patent
Kubota et al.

(10) Patent No.: US 6,597,571 B2
(45) Date of Patent: Jul. 22, 2003

(54) ELECTRIC SYSTEM WITH SAFETY DEVICE AGAINST SPREAD OF FIRE OCCURRED INSIDE CASING

(75) Inventors: Hiroshi Kubota, Tokyo (JP); Hiroshi Kiire, Tokyo (JP); Kiyoshi Nagatsuka, Tokyo (JP); Hiroshi Ootani, Tokyo (JP); Junya Sakurai, Tokyo (JP); Shintarou Fujioka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/095,252

(22) Filed: Mar. 12, 2002

(65) Prior Publication Data

US 2002/0139554 A1 Oct. 3, 2002

(30) Foreign Application Priority Data

Mar. 30, 2001 (JP) .......................................... 2001-99976

(51) Int. Cl.[7] ................................................ H05K 7/20
(52) U.S. Cl. ........................ 361/695; 361/690; 361/692; 174/16.1; 454/184; 165/104.33; 165/122
(58) Field of Search ................................. 361/689–695, 361/704, 720; 174/16.1, 16.3, 17 R, 17 VA, 52.2; 454/184; 165/80.3, 122; 62/259.2

(56) References Cited

U.S. PATENT DOCUMENTS

| | | | | | |
|---|---|---|---|---|---|
| 4,194,521 A | * | 3/1980 | Banta | ............................ | 137/67 |
| 5,398,467 A | * | 3/1995 | Ricq et al. | ..................... | 52/232 |
| 6,002,584 A | * | 12/1999 | Messmer et al. | ........... | 361/690 |
| 6,072,397 A | * | 6/2000 | Ostrowski | ..................... | 340/588 |
| 6,252,167 B1 | * | 6/2001 | Rose | ............................ | 174/66 |
| 6,301,108 B1 | * | 10/2001 | Stockbridge | ................. | 361/688 |
| 6,342,004 B1 | * | 1/2002 | Lattimore et al. | ........... | 454/184 |
| 6,404,629 B1 | * | 6/2002 | Austin et al. | ................ | 361/690 |

FOREIGN PATENT DOCUMENTS

JP          04006898 A  *  1/1992  ............ H05K/5/00

* cited by examiner

*Primary Examiner*—Boris Chervinsky
(74) *Attorney, Agent, or Firm*—Foley & Lardner

(57) ABSTRACT

An electric system has exothermic components housed in a case; the case is formed with ventilation holes, and a fan forcibly evacuates the hot air from the inner space through the ventilation holes for removing heat from the exothermic components; foamable pain is spread on the surface near the ventilation hole, and a fuse element is exposed to the air passage; when a fire breaks out inside the case, the paint foams for closing the ventilation hole, and the fuse element stops the fans, whereby the fire is extinguished without being spread to the outside the case.

20 Claims, 5 Drawing Sheets

ELECTRIC SYSTEM WITH SAFETY DEVICE AGAINST SPREAD OF FIRE OCCURRED INSIDE CASING

FIELD OF THE INVENTION

This invention relates to prevention against the spread of a fire suitable for an electric system and, more particularly, to an electric system equipped with safety device against the spread of a fire occurred in a housing where electronic components are accommodated.

DESCRIPTION OF THE RELATED ART

An electronic system is a combination of electric components. The electric components such as, for example, monolithic integrated circuit devices are mounted on the circuit boards, and the circuit boards are usually accommodated in a case. The electric components, circuit boards and the case are usually made of incombustible material recommended in UL (Underwriters Laboratories inc.) standards. When a fire breaks out inside the case, the incombustible material resists against the spread of the fire.

The electric components are exothermic, and raise the temperature inside the case. The high temperature ambience is causative of malfunction. If the electric components generate non-ignoreable amount of heat, a forced ventilation device such as a ventilation fan is required for the electric system. The ventilation fan is attached to the case, and forcibly evacuates the high-temperature air from the inside space to the environment.

However, the ventilation fan is undesirable from the viewpoint of the prevention against the spread of a fire, because fresh oxygen is forcibly supplied to the fire. Even though the incombustible material is used inside the case, the fresh oxygen promotes the fire, and the fire is spread from the case to the outside. When the fire breaks out at a component in a lower portion inside the case, the fire is easily spread toward components in a higher portion inside the case. If a fire-protection shutter is provided inside the case, the fire-protection shutter prevents the components in the higher portion from the fire. However, the fire-protection shutter mechanism and the actuator for it are costly.

SUMMARY OF THE INVENTION

It is therefore an important object of the present invention to provide a safety device against a fire, which is economical and effective against a fire breaking out inside a case equipped with a ventilation device.

To accomplish the object, the present invention proposes to interrupt the air flow by using foam produced from a piece of foamable substance.

In accordance with one aspect of the present invention, there is provided an electric system comprising a case formed with at least one ventilation hole open to an inner space defined therein and an environmental space outside thereof and accommodating at least one exothermic electric component, and at least one piece of foamable substance provided on a surface of the case around the at least one ventilation hole and producing foam for reducing an open area of the aforesaid at least one ventilation hole when fire heats the piece of formable substance.

In accordance with another aspect of the present invention, there is provided an electric system comprising a case formed with at least one ventilation hole open to a first inner space defined therein and an environmental space outside thereof, at least one circuit board box accommodated in the inner space and having at least one circuit board where at least one exothermic electric component is mounted and a casing retaining the aforesaid at least one circuit board in a second inner space defined therein and formed with at least one air passage open to both of the first and second inner spaces, a ventilation device attached to the case and forcibly supplying the air from the environmental space through the first inner space to the second inner space for removing heat from the aforesaid at least one exothermic electric component, and at least one foamable panel partitioning the first inner space into a first inner sub-space connected through the aforesaid at least one ventilation hole to the environmental space and a second sub-space where the aforesaid at least one circuit board box is located and having a base plate formed with at least one hole open to the first and second sub-spaces and a piece of foamable substance provided on a surface of the base plate around the aforesaid at least one hole and producing foam for closing the aforesaid at least one hole when fire heats the piece.

In accordance with yet another aspect of the present invention, there is provided an electric system comprising a case formed with at least one ventilation hole open to an inner space defined therein and an environmental space outside thereof and having at least one circuit board where at least one exothermic electric component is mounted, a ventilation device attached to the case, and forcibly supplying the air from the environmental space to the inner space for removing heat from the aforesaid at least one exothermic electric component, and at least one foamable panel partitioning the inner space into a first inner sub-space connected through the aforesaid at least one ventilation hole to the environmental space and a second sub-space where the aforesaid at least one circuit board is located, and having a base plate formed with at least one hole open to the first and second sub-spaces and a piece of foamable substance provided on a surface of the base plate around the aforesaid at least one hole and producing foam for closing the aforesaid at least one hole when fire heats the piece.

BRIEF DESCRIPTION OF THE DRAWINGS

The features and advantages of the safety device against a fire will be more clearly understood from the following description taken in conjunction with the accompanying drawings, in which FIG. 8 is a schematic plane view showing airflow which ventilation fans give rise to, and FIG. 9 is a schematic front view showing the airflow which the ventilation fans give rise to.

DESCRIPTION OF THE PREFERRED EMBODIMENTS

First Embodiment

Figure 1:
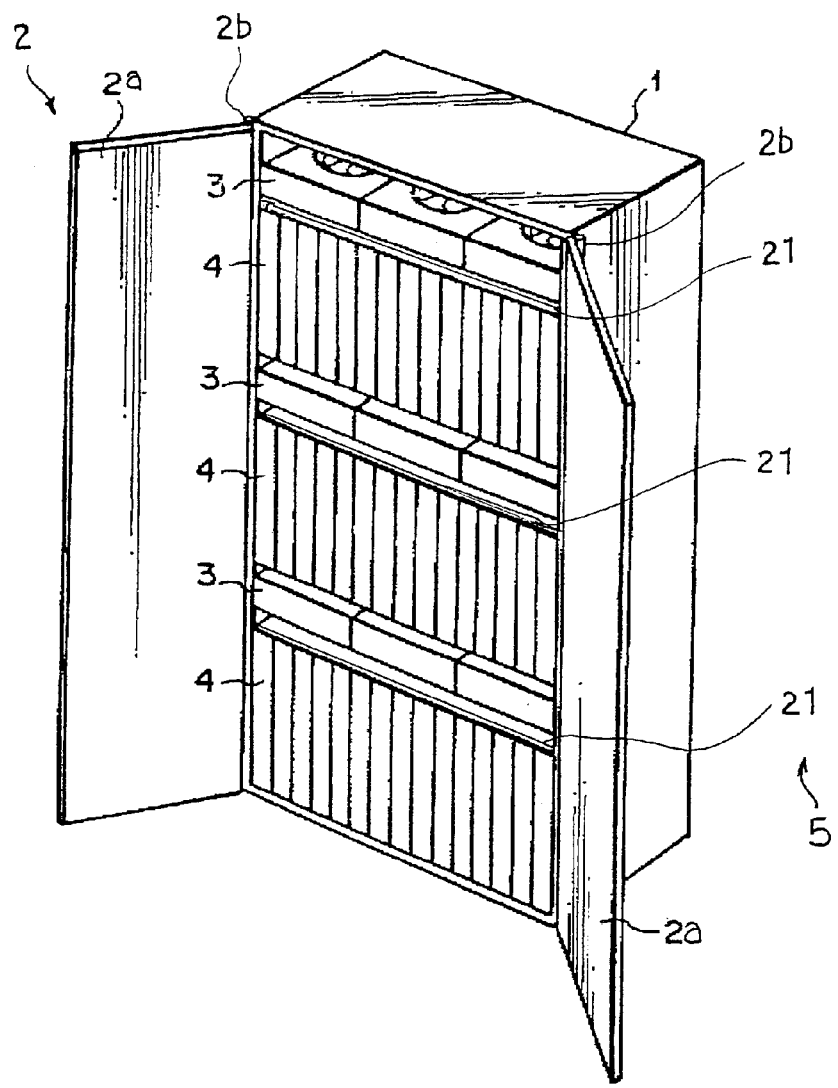
FIG. 1 is a perspective view showing the arrangement of an electric system according to the present invention.

Referring first to FIG. 1 of the drawings, an electric system embodying the present invention largely comprises a case 1, a double-leafed hinged door 2, plural ventilation fan units 3, circuit board boxes 4 and a safety device 5. The electric system is, by way of example, a main-frame computer system, communication terminal or an exchanger.

The case 1 has a rectangular parallelepiped configuration, and has an opening on the front side thereof. The double-leafed hinged door 2 includes a pair of plates 2a and hinges 2b. Each of the plates 2a is half as wide as the opening, and the plates 2a are hinged to both side surfaces of the case. The plates 2a are turnable about the hinges 2b. When a user closes the double-leafed hinged door 2, the opening is covered with the pair of plates 2a. On the other hand, when the user closes the double-leafed hinged door 2, the sets of ventilation fans 3, circuit board boxes 4 and the safety device 5 are exposed as shown in FIG. 1.

The ventilation fan units 3 are alternated with the circuit board boxes 4, and safety panels 21, which form in combination the safety device 5, are provided between each circuit board box 4 and the associated ventilation fan unit 3. As will be seen in FIG. 2, the ventilation fan unit 3 has plural fans 3a rotatably supported by a casing 3b and motors (not shown) connected to the fans 3a. Though not shown in FIG. 2, the motors are connected through a driving circuit 3c to an electric power source 3d.

A fuse element 3e is connected between the driver 3c and the electric power supply 3d. The fuse element 3e is, by way of example, formed of tin-bismuth-lead alloy, and is broken at the melting point of the tin-bismuth-lead alloy. The melting temperature of the tin-bismuth-lead alloy is of the order of 95 degrees in centigrade. The fuse element 3e is sensitive to the temperature inside the case 1. When the space inside the case 1 exceeds a predetermined temperature, the fuse element 3e is broken, and forcibly stops the fans 3a. The driving circuit 3c and the fuse element 3e may be provided inside the casing 3b. The ventilation fan units 3 are secured to the inner surfaces of the case 1 at intervals.

The circuit board box 4 includes a rectangular parallelepiped case 4a and plural printed circuit boards 25. Plural electric components 25a such as, for example, monolithic integrated circuit devices are mounted on each printed circuit board 25, and are electrically connected to conductive strips patterned on the printed circuit board 25. The electric components 25a are exothermic. The conductive strips are connected to a terminal connector (not shown). The rectangular parallelepiped case 4a has an opening on the front side.

Plural slits 23 are formed in the upper and lower surfaces of the rectangular parallelepiped case 4a, and connectors 24 are embedded in the back surface of the rectangular parallelepiped case 4a at intervals. The printed circuit boards 25 are inserted into the rectangular parallelepiped case 4a, the terminal connectors on the printed circuit boards 25 are engaged with the connectors 24, and are secured to the rectangular parallelepiped case 4a at intervals. The slits 23 allow the air to pass through the inside space, in which the printed circuit boards 25 are stored, and the air carries the heat generated by the circuit components. The circuit board boxes 4 are supported by the case 1 at intervals, and are alternated with the ventilation fan units 3 inside the case 1.

Figure 3:
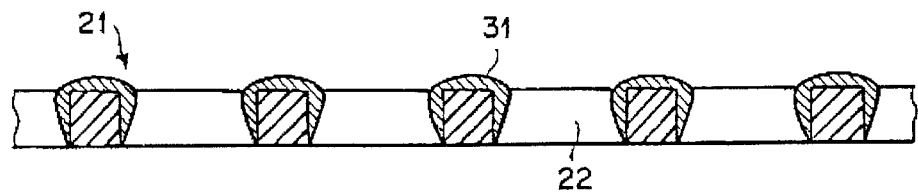
FIG. 3 is a cross sectional view showing a safety device incorporated in the electric system.

Each of the safety panels 21 is provided between the ventilation fan unit 3 and the associated circuit board box 4. A lot of through-holes 22 are formed in the safety panel 21, and allow the air to pass therethrough. The upper surface and inner surfaces defining the through-holes 22 are coated with high-temperature foamable paint 31 as shown in FIG. 3. Paint, which is manufactured by Flame Control Corporation, is an example of the high-temperature foamable paint, and is sold as "Flame Control" in the market. The paint contains foamable substance. When the foam is produced, the foam is resistive against the fire.

Figure 2:
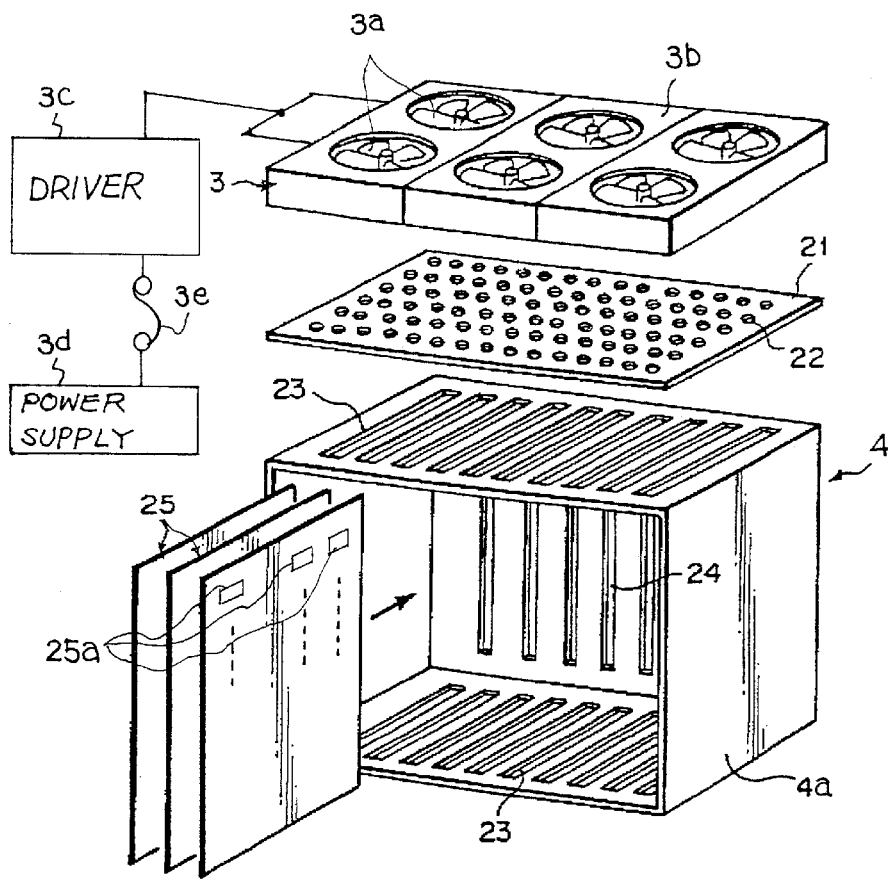
FIG. 2 is a fragmentary perspective view showing the electronic system.
Figure 4:
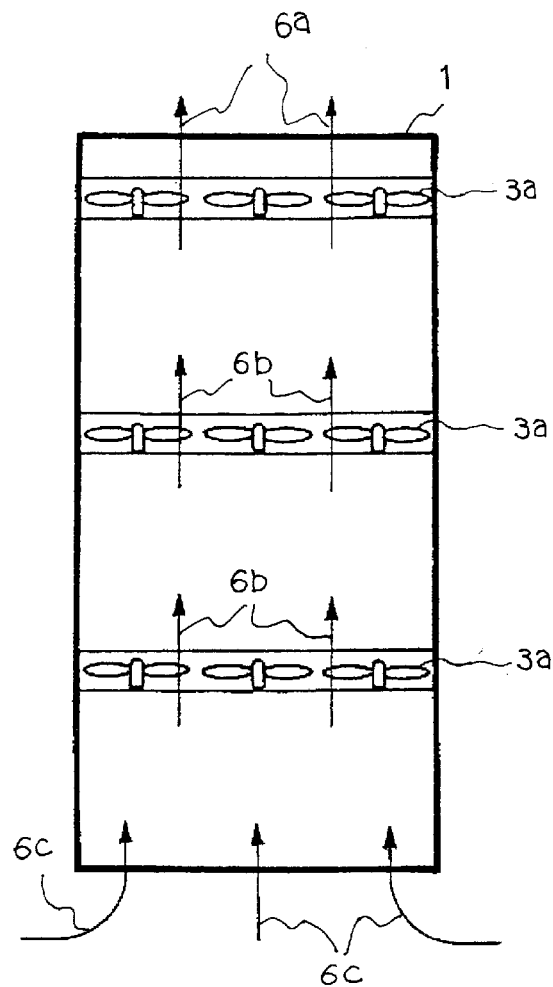
FIG. 4 is a schematic front view showing airflow which ventilation fans of the electric system give rise to, FIG. 5 is a cross sectional view showing form produced from the safety device for closing air passages.

Description is hereinbelow made on the behavior of the safety device 5 with reference to FIGS. 4 and 5 concurrently with FIGS. 1 to 3. While the electric system is operating, the electric components 25a are activated, and generate heat inside the rectangular parallelepiped cases 4a. The heat is propagated from the circuit components 25a to the air inside the rectangular parallelepiped cases 4a, and the air temperature rises. The heat is further propagated from the rectangular parallelepiped cases 4a to the air inside the case 1, and the air temperature also rises.

The fans 3a are driven for rotation, and the hot air 6a is forcibly evacuated from the space inside the case 1, and gives rise to airflow 6b inside the case 1. The air 6b flows through the holes 22 formed in the safety panels 21 and the slits 23 formed in the rectangular parallelepiped cases 4a. The fresh air 6c is induced from the environment into the case 1, and cools down the circuit components 25a. For this reason, the hot air does not reach the melting temperature of the tin-bismuth-lead alloy.

Assuming now that a fire breaks out inside the case 1. The fire rapidly raises the air temperature inside the case 1. When the air temperature reaches the melting point of the fuse elements 3e, the fuse elements 3e are broken, and the electric power is no longer supplied to the motors. The fans 3a stop, and the fresh air 6c is never supplied from the environment to the space inside the case 1.

Figure 5:
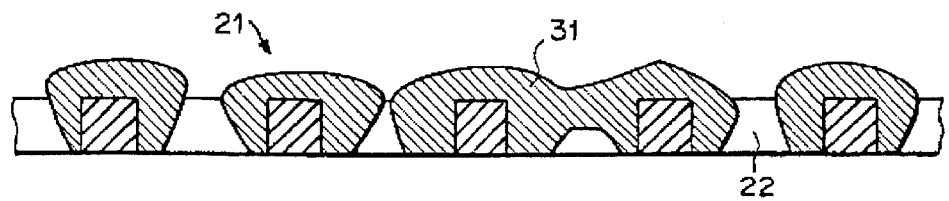

If the fire reaches the safety panels 21, the paint layer 31 foams, and partially or completely closes the holes 22 as shown in FIG. 5. The foam 31 does not allow the air 6b to flow through the holes 22. The fire is blocked from the fresh air, and is finally extinguished.

As will be understood from the foregoing description, the electric system has two anti-firing means. One of the two means is the fuse elements 3e, which forcibly stop the electric power. The other means is the foamable paint, the foam of which closes the air passage so as to stop the oxygen to the fire.

Second Embodiment

Figure 6:
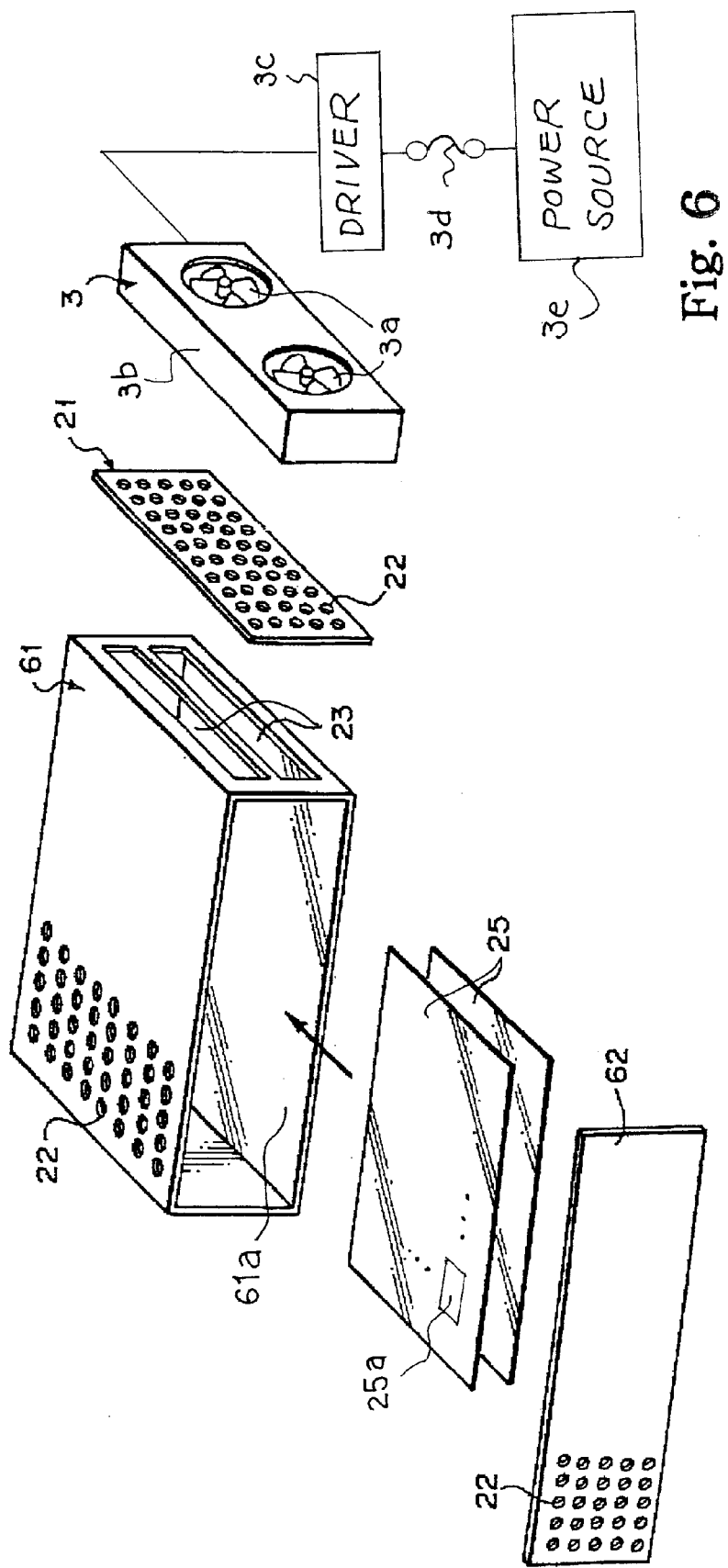
FIG. 6 is a fragmentary perspective view showing another electric system according to the present invention.

Turning to FIG. 6 of the drawings, another electric system embodying the present invention comprises a case 61, plural printed circuit boards 25, a ventilation device 3, a foamable panel 21 and a front panel 62. The electric system is, by way of example, a personal computer or a home electronic device such as a video reproducer and sound reproducer.

Figure 7:
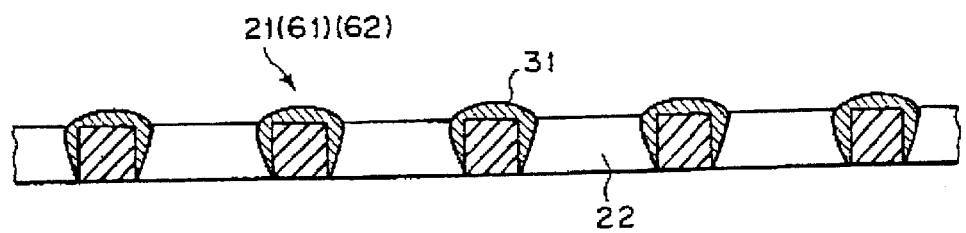
FIG. 7 is a cross sectional view showing a safety device incorporated in the electric system.

The case 61 has a rectangular parallelepiped configuration, and, accordingly, has a rear panel, a bottom panel, an upper panel and a pair of side panels. These panels define an inner space. A wide opening 61a is formed in the front surface of the case 61, and the inner space is open to the environmental space outside the case 61 through the opening 61a. The opening 61a is closed with the front panel 62. Plural through-holes 22 are formed in the front panel 62, and the through-holes 22 allow the air to flow therethrough. The inner surface of the front panel 62 and the surfaces defining the holes 22 are covered with the foamable paint as shown in FIG. 7. As described hereinbefore, when foamable pain is heated with fire, foam is produced from the formable paint. However, the foam is not produced in the hot air inside the case 61.

Turning back to FIG. 6, circuit components 25a are mounted on each of the printed circuit boards 25, and are electrically connected to a conductive pattern formed on the printed circuit board 25. Most of the circuit components are exothermic, and heats the air inside the case 61. The conductive pattern is further connected to a terminal connector. Though not shown in FIG. 6, terminal connectors are provided in parallel on an inner surface of the rear panel. When the printed circuit boards 25 are inserted through the opening into the inner space of the case 61, the printed circuit boards 25 are horizontally supported by the case 61, and the conductive patterns on the printed circuit boards 25 are electrically connected through the terminal connectors thereon to the terminal connectors on the inner surface of the rear panel. The terminal connectors on the inner surface of the rear panel offer signal propagation paths between the printed circuit boards 25 and to signal ports (not shown), and distribute electric power from a power port to the printed circuit boards 25.

Plural through-holes 22 are further formed in the upper panel of the case 61, and allow the air to flow therethrough. The inner surface of the upper panel and the surfaces defining the holes 22 are covered with the foamable paint (see FIG. 7). When the foamable paint is heated with fire, foam is produced therefrom. A pair of slit 23 is formed in one of the side panels of the case 61, and are laterally extend in parallel to each other. The ventilation device 3 is attached to the side panel formed with the slits 23, and the formable panel 21 is inserted between the side panel of the case 61 and the ventilation device 3.

The ventilation device 3 has two fans 3a, a casing 3b, electric motors (not shown), a driving circuit 3c and a fuse element 3d. The fans 3a are rotatably supported by the casing 3b, and the electric motors (not shown) are connected to the fans 3a, respectively. An electric power source 3e supplies power voltage through the fuse element 3d to the driver circuit 3c. When the electric system is powered, the power voltage is supplied through the fuse element 3d and the driver circuit 3c to the electric motors, and the fans 3a are driven for rotation. The fuse element 3d is sensitive to the air inside the case 61. When the air temperature exceeds the melting point of the fuse element, the fuse element 3d is broken, and the electric power is no longer supplied to the driver circuit 3c. The driver circuit 3c and the fuse element 3d may be provided inside the casing 3b.

Figure 8:
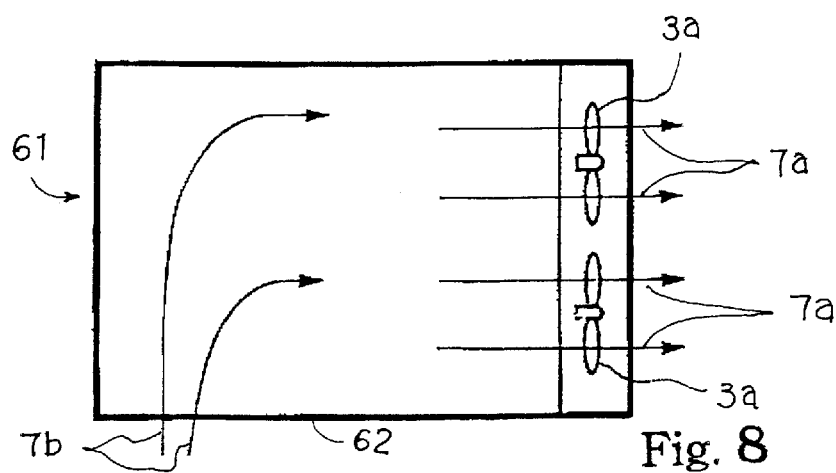
Figure 9:
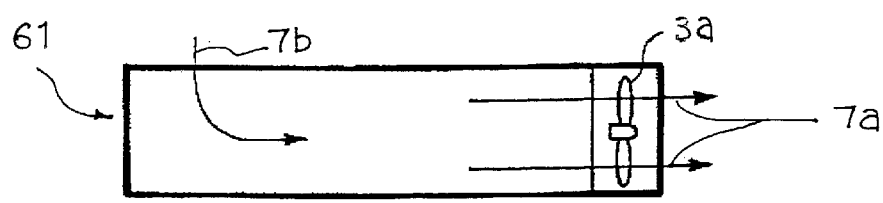

While the fans 3a is rotating, the hot air 7a is forcibly evacuated from the inner space of the case 61 through the foamable panel 21 to the environmental space, and fresh air 7b is induced through the holes 22 in the front panel 62 (see FIG. 8) and the holes 22 in the upper panel of the case 61 (see FIG. 9) into the inner space. The fresh air 7b removes the heat from the electric components 25a, and rises in temperature.

The foamable panel 21 is retained in parallel to the side surface, and is perpendicular to the upper/bottom panels of the case 61. Plural holes 22 are formed in the foamable panel 21, and allow the air to flow therethrough. The inner surface of the foamable panel 21 and the surfaces defining the holes 21 are coated with the foamable paint. The foamable paint foams in the presence of fire. However, the hot air can not cause the foamable paint to foam.

Assuming now that a fire breaks out inside the case 61, the fresh air 7b promotes the fire, and the fire spreads inside the case 61. When the fire reaches the front panel 62 and/or the upper panel of the case 61, the paint foams, and the foam partially or completely closes the holes 22. The fresh air 7b is hardly supplied to the fire. When the fire reaches the foamable panel 21, the paint forms, and the foam partially or completely closes the holes 22. Even if the fans 3a are continuously driven for rotation, the fire is hardly spread to a combustible good outside the case 61. If the fuse element 3d is broken before the fire reaches the foamable panel 21, the fans 3a stop, and the forced ventilation does not take place.

As will be appreciated from the foregoing description, the electric system is equipped with the safety device, i.e., the panels coated with the foamable paint, and the fuse element 3d is independent of the panels coated with the foamable paint. The foamable paint foams, and the foam closes the air passage to the fire. The foamable substance is more economical rather than the shutter and the actuator. On the other hand, the fuse element 3d stops the forced ventilation. As a result, the fire is extinguished without spread to the outside of the case.

Although particular embodiments of the present invention have been shown and described, it will be apparent to those skilled in the art that various changes and modifications may be made without departing from the spirit and scope of the present invention.

The fuse elements may be omitted from an electric system according to the present invention. Namely, only the foamable panel or panels may be incorporated in the case. Even if the fans are continuously rotated, the foam interrupts the air passages, and the fire is hardly spread to the outside the case.

Any sort of foamable substance is available for the safety device, i.e., the formable panel in so far as the substance foams when the fire heats it. Thus, the formable "paint" does not set any limit to the present invention.

A wired circuit board may be housed in the circuit board box or the case.

The safety device may be used in other home electronics such as, for example, a drier and refrigerator.

The fuse element may be replaced with a thermo-sensor. Although the thermo-sensor is not broken, the thermo-sensor detects abnormal temperature rise, and instructs the driver circuit to stop the fans.

What is claimed is:

1. An electric system comprising:
   a case having at least one ventilation hole open to an inner space defined therein, and accommodating at least one exothermic electric component comprising a circuit component arranged on a circuit board together with other circuit components;
   a ventilation device provided in said case near said at least one ventilation hole so as to create airflow through said at least one ventilation hole; and
   a partition panel separating the ventilation device from the circuit board, a ventilation hole of the partition panel having a foamable substance for reducing an open area of the ventilation hole of the partition panel when fire heats said foamable substance.

2. The electric system as set forth in claim 1, further comprising a thermo-sensor responsive to a high temperature due to fire inside said case for stopping said ventilation device.

3. The electric system as set forth in claim 2, wherein said ventilation device includes at least one fan unit driven for rotation to create said airflow and a driving circuit connected to said thermo-sensor for supplying electric power to said fan unit in the absence of fire.

4. The electric system as set forth in claim 3, wherein said thermo-sensor is a fuse element connected between a power source and said driving circuit.

5. The electric system as set forth in claim 1, further comprising a foamable substance provided on a surface of said case around said at least one ventilation hole and producing foam for reducing an open area of said at least one ventilation hole when fire heats said foamable substance.

6. The electric system as set forth in claim 5, further comprising a thermo-sensor responsive to a high temperature due to fire inside said case for stopping said ventilation device.

7. The electric system as set forth in claim 6, wherein said ventilation device includes at least one fan unit driven for rotation to create said airflow and a driving circuit connected to said thermo-sensor for supplying electric power to said fan unit in the absence of fire.

8. The electric system as set forth in claim 7, wherein said thermo-sensor is a fuse element connected between a power source and said driving circuit.

9. The electric system as set forth in claim 5, wherein said case is further formed with another ventilation hole through which said airflow passes, and said foamable substance is provided in the vicinity of said another ventilation hole.

10. The electric system as set forth in claim 1, wherein said circuit board is housed in a box together with other circuit boards having exothermic circuit components arranged thereon, and wherein holes are formed in said box for allowing air flow between said inner space of the case and a space defined in said box.

11. The electric system as set forth in claim 10, further comprising a thermo-sensor detecting the temperature of said airflow and responsive to a high temperature due to fire inside said box for stopping said ventilation device.

12. The electric system as set forth in claim 11, wherein said ventilation device includes at least one fan unit driven for rotation to create said airflow and a driving circuit connected to said thermo-sensor for supplying electric power to said fan unit in the absence of fire.

13. The electric system as set forth in claim 12, wherein said thermo-sensor is a fuse element connected between a power source and said driving circuit.

14. The electric system as set forth in claim 11, further comprising another box for another set of circuit boards and another ventilation device in said case on the opposite side of said ventilation device with respect to said box.

15. An electric system comprising:
a case formed with at least one ventilation hole open to a first inner space defined therein and an environmental space outside thereof, at least one circuit board box accommodated in said inner space, and having at least one circuit board where at least one exothermic electric component is mounted and a casing retaining said at least one circuit board in a second inner space defined therein and formed with at least one air passage open to both of said first and second inner spaces;

a ventilation device attached to said case, and forcibly supplying the air from said environmental space through said first inner space to said second inner space for removing heat from said at least one exothermic electric component; and at least one foamable panel partitioning said first inner space into a first inner sub-space connected through said at least one ventilation hole to said environmental space and a second sub-space where said at least one circuit board box is located, and having a base plate formed with at least one hole open to said first and second sub-spaces and a piece of foamable substance provided on a surface of said base plate around said at least one hole and producing foam for closing said at least one hole when fire heats said piece.

16. The electric system as set forth in claim 15, in which said ventilation device includes at least one fan unit driven for rotation so as to give rise said airflow and a driving circuit connected to said thermo-sensor for supplying an electric power to said fan unit in the absence of said fire.

17. The electric system as set forth in claim 16, in which said thermo-sensor is a fuse element connected between a source of power voltage and said driving circuit.

18. An electric system comprising:
a case formed with at least one ventilation hole open to an inner space defined therein and an environmental space outside thereof, and having at least one circuit board where at least one exothermic electric component is mounted;

a ventilation device attached to said case, and forcibly supplying the air from said environmental space to said inner space for removing heat from said at least one exothermic electric component; and at least one foamable panel partitioning said inner space into a first inner sub-space connected through said at least one ventilation hole to said environmental space and a second sub-space where said at least one circuit board is located, and having a base plate formed with at least one hole open to said first and second sub-spaces and a piece of foamable substance provided on a surface of said base plate around said at least one hole and producing foam for closing said at least one hole when fire heats said piece.

19. The electric system as set forth in claim 18, in which said ventilation device includes at least one fan unit driven for rotation so as to give rise said airflow and a driving circuit connected to said thermo-sensor for supplying an electric power to said fan unit in the absence of said fire.

20. The electric system as set forth in claim 19, in which said thermo-sensor is a fuse element connected between a source of power voltage and said driving circuit.

* * * * *